(12) United States Patent
Mannhart et al.

(10) Patent No.: US 6,481,614 B2
(45) Date of Patent: Nov. 19, 2002

(54) APPARATUS FOR MOUNTING SEMICONDUCTOR CHIPS ON A SUBSTRATE

(75) Inventors: Eugen Mannhart, Cham (CH); August Enzler, Hünenberg (CH); André Odermatt, Hünenberg (CH)

(73) Assignee: ESEC Trading SA, Cham (CH)

( * ) Notice: Subject to any disclaimer, the term of this patent is extended or adjusted under 35 U.S.C. 154(b) by 48 days.

(21) Appl. No.: 09/808,776

(22) Filed: Mar. 15, 2001

(65) Prior Publication Data

US 2001/0035450 A1 Nov. 1, 2001

(30) Foreign Application Priority Data

Mar. 17, 2000 (CH) ................................................ 0511/00

(51) Int. Cl.$^7$ ........................ B23Q 15/00; B23K 37/00; H01R 43/00
(52) U.S. Cl. ........................ 228/9; 228/4.1; 228/105; 29/827
(58) Field of Search ........................ 228/6.2, 8–9, 102, 228/103, 105, 4.1, 44.3; 29/564, 564.1, 564.6, 711, 712, 827; 198/345, 456

(56) References Cited

U.S. PATENT DOCUMENTS 3,738,560 A * 6/1973 Kulicke et al. ................ 219/79
4,103,814 A * 8/1978 Nishioka ................ 228/180.21
4,364,086 A * 12/1982 Guth ........................... 348/87
5,163,222 A 11/1992 Imlia et al.
5,238,174 A 8/1993 Ricketson et al.
5,944,281 A * 8/1999 Pittman et al. ............. 244/3.12
6,129,040 A 10/2000 Viggiano et al.
6,160,931 A * 12/2000 Asakura ...................... 359/124

FOREIGN PATENT DOCUMENTS

CH  689 188 A5  11/1998
EP  077 544 A1  11/1998

* cited by examiner

Primary Examiner—Tom Dunn
Assistant Examiner—Zidia Pittman
(74) Attorney, Agent, or Firm—McCormick, Paulding & Huber LLP

(57) ABSTRACT

The invention concerns an apparatus for mounting semiconductor chips on a substrate with which the substrate is forwarded in steps in a first direction to a bonding station for the presentation of a next substrate position. In order that curved substrates or substrates otherwise slightly shifted in their position at right angles to the transport direction can be presented with positional accuracy at the bonding location, it is suggested that the position of the longitudinal edge of the substrate is measured at right angles to the transport direction at the level of the bonding station and then to carry out a corrective movement with the substrate. An optical sensor with two light barriers arranged next to each other is suggested for the sensor.

21 Claims, 2 Drawing Sheets

APPARATUS FOR MOUNTING SEMICONDUCTOR CHIPS ON A SUBSTRATE

BACKGROUND OF THE INVENTION

The invention concerns an apparatus for mounting semiconductor chips on a substrate.

Such automatic assembly machines are generally known as Die Bonders. On mounting the semiconductor chips, a transport arrangement feeds the substrate in steps to a dispensing station where adhesive is applied and then to a bonding station where the next semiconductor chip is placed. Transport arrangements have become known from the U.S. Pat. No. 5,163,222 and the Swiss patent CH 689 188 with which the alignment of the substrate at right angles to the transport direction takes place mechanically in that the substrate is pulled against a stop. A disadvantage with this solution is that certain substrates bend when they are pulled against the stop. On the other hand, automatic assembly machines are available on the market with which the position of the substrate is determined and corrected immediately before placing the next semiconductor chip by means of a camera and electronic image processing. Such a solution is known from European patent application EP 877 544. This solution has two considerable disadvantages: It is time-consuming at the cost of the cycle time and is expensive. High placement accuracy and short cycle times however are demanded from automatic assembly machines.

A leadframe work station with a movable indexing head for the transport of the leadframe is known from U.S. Pat. No. 5,238,174. It is also known, that a leadframe may have a curved edge. The indexing head comprises a sensor, with which the position of the curved edge is detected before grasping and transporting the leadframe. As sensor a light barrier is foreseen. Positional errors due to the curvature of the edge of the leadframe can thus be partially compensated for. However after grasping, the leadframe is mechanically aligned at the indexing head. The indexing head transports the leadframe to the work station, where it is clamped by a downholder system while it is worked on. The placement accuracy achieves at best about 25 µm. In order to achieve the accuracy which is necessary for example when wiring a semiconductor chip the leadframe is measured by means of a camera after clamping by the downholder system.

The object of the invention is to improve the placement accuracy of the mounted semiconductor chips at short cycle times.

SUMMARY OF THE INVENTION

The invention suggests measuring the position of the longitudinal edge of the leadframe at right angles to the transport direction at the height of the bonding station and then to carry out a corrective movement with the substrate so that the substrate position is presented with positional accuracy at the right location for bonding. An optical sensor with two light barriers arranged side by side is suggested for this measurement.

BRIEF DESCRIPTION OF THE DRAWINGS

An embodiment of the invention is explained in more detail below based on the drawing. The illustrations are not to scale.

It is shown in.

DESCRIPTION OF THE PREFERRED EMBODIMENTS

Figure 1:
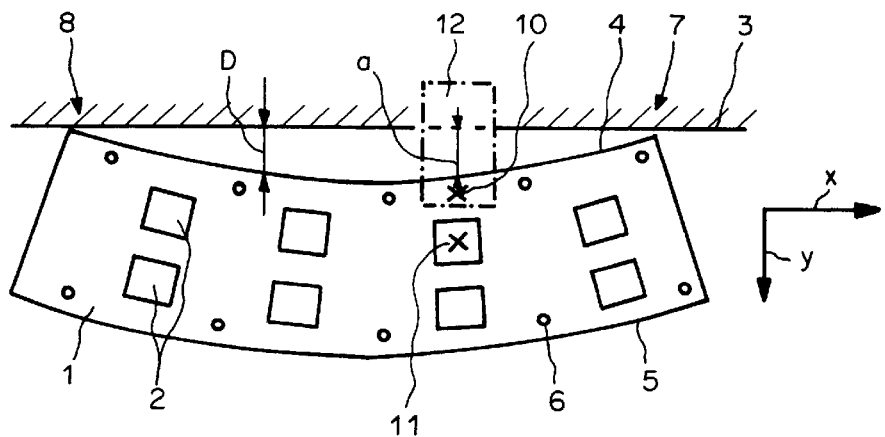
FIG. 1 Parts of an apparatus for mounting semiconductor chips and a leadframe.

FIG. 1 shows those parts of an apparatus for mounting semiconductor chips on a substrate necessary for understanding the invention. The substrate is an elongated metallic leadframe 1 with a number of chip islands 2 arranged one behind the other and next to each other onto each of which a semiconductor chip is to be placed. The leadframe 1 is only presented schematically. The apparatus comprises a transport system for transporting the leadframe 1, a dispensing station for the application of adhesive to the leadframe 1 and a bonding station at which a Pick and Place system places one semiconductor chip after the other onto the leadframe 1.

The leadframe 1 is always located in a horizontal transport plane xy and is moved in a transport direction x. The leadframe 1 rests on a heatable support plate which forms a horizontal sliding track for the leadframe 1 and lies in the transport plane xy and is preferably fed in steps in transport direction x to the dispensing station and the bonding station by means of a system of fixed and movable clamps. Such a transport system is described in European patent EP 330831 and is therefore not explained in more detail here. The transport of the leadframe 1 could also take place by means of a transport system which only has one single movable clamp. The leadframe 1 is moved by the clamps, or clamp if only one single clamp is available, in lateral direction, ie, pulled in negative y direction against a guide rail 3 arranged parallel to the transport direction x serving as a stop and is thereby aligned to this. The leadframe 1 has holes 6 along its longitudinal edges 4 and 5 which are scanned by a not presented optical sensor and used for the accurate positioning of the leadframe 1 in transport direction x.

Figure 2:
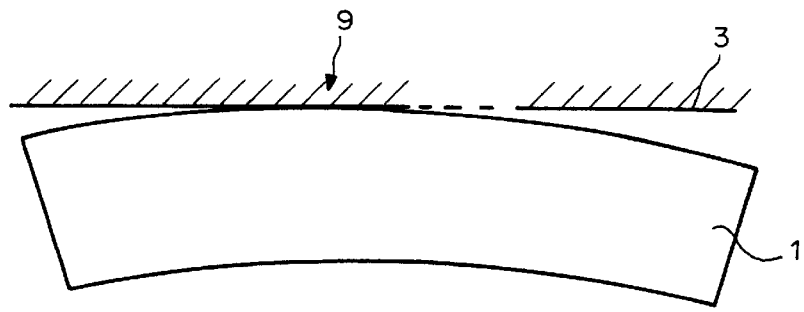
FIG. 2 a further leadframe.

The leadframe 1 drawn in FIG. 1 is curved, whereby the curvature presented is strongly exaggerated. For this reason, only a front and a rear edge area 7 and 8 of the longitudinal edge 4 of the leadframe 1 rest on the guide rail 3. The distance D between the longitudinal edge 4 of the leadframe 1 and the guide rail 3 is not constant but location dependent. It can amount to up to 80 µm. Consequently, the distance between the chip islands 2 and the guide rail 3 is subject to certain variations. If the leadframe 1, as is shown in FIG. 2, is curved on the other side, then only one edge area 9 rests on the guide rail 3.

In FIG. 1 the set position at which, as long as no corrective measures are taken, the Pick and Place system will place the next semiconductor chip is marked with a first cross 10. Because of the curvature of the leadframe 1, the set position does not match the actual position, marked by a second cross 11, which should be occupied by the semiconductor chip on the leadframe 1: The actual position is shifted in relation to the set position by the distance a which designates the current distance of the longitudinal edge 4 of the leadframe 1 from the guide rail 3 at the location of the bonding station. In order to bring the actual position in line with the set position before placing the next semiconductor chip, it is foreseen to always measure the distance a by means of a sensor 12 and then to shift the guide rail 3 and the clamp at right angles to the transport direction x, namely in negative y direction, by the measured distance a. The leadframe 1 pulled against the guide rail 3 by the clamp is thereby also shifted and the deviation between the actual position and the set position is made to disappear.

Figure 3:
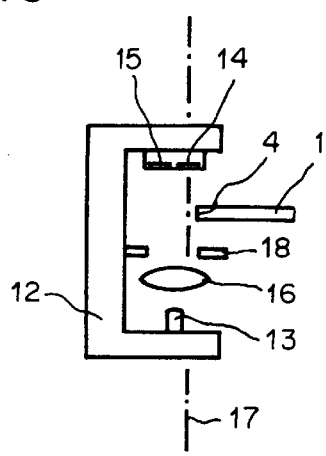
FIG. 3 a sensor.

FIG. 3 shows a cross-section along the y direction of a sensor 12 suitable for measuring the distance a. The sensor 12 is secured to the guide rail 3 (FIG. 1). The guide rail 3 has a recess in the area of the sensor 12. The sensor 12 has a light source 13 and two opto-receivers 14 and 15 arranged in y-direction (FIG. 1) one after the other so that two light barriers are formed. Preferably, a lens 16 is arranged in the beam path between the light source 13 and the two opto-receivers 14 and 15 so that the light source is located in the focal point of the lens 16. The lens 16 concentrates the light radiated from the light source 13 into parallel beams of light which strike the leadframe 1 almost vertically in the area of the longitudinal edge 4. The level of the guide rail 3 on which the edge areas 7 and 8 of the leadframe 1 presented in FIG. 1 rest is drawn with a broken line 17. Typically, the two opto-receivers 14 and 15 each have dimensions of 1 mm×1 mm. The sensor 12 and the guide rail 13 are aligned to each other so that the leadframe 1 only interrupts beams which run from the lens 16 to the first opto-receiver 14 and not beams which run from the lens 16 to the second opto-receiver 15. That means, that the shadow of the leadframe 1 illuminated by the light source 13 always falls on the first opto-receiver 14 while the second opto-receiver 15 is not shadowed.

The holes 6 inserted along the longitudinal edges 4, 5 of the leadframe 1 are only 0.4 mm apart from the rim. Preferably, one or more aperture plates 18 are arranged in the beam of light between the lens 16 and the opto-receiver 14 so that either none of the light emitted from the light source 13 can get through such a hole 6 or that at most, light which can get through such a hole 6 does not fall on the opto-receiver 14. Optionally, further optical elements can be foreseen in the beam of light.

Figure 4:
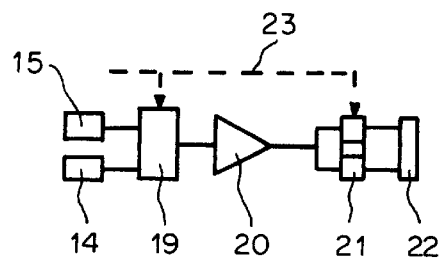
FIG. 4 an electronic circuit.

The second opto-receiver 15 serves as a reference so that deviations in the brightness of the light source 13 and deviations in the sensitivity of the opto-receiver 14 can be compensated. The two opto-receivers 14 and 15 are preferably located on the same semiconductor chip so that as far as possible they show the same light and temperature sensitivity. The two light barriers are operated with the Lock-in technique whereby the amplitude of the current supplying the light source 13 is modulated for example with a frequency of 200 kHz. A light-emitting diode is preferably used as the light source 13 as the amplitude of a light-emitting diode can be modulated by 100% while with a laser diode modulation of the amplitude is only possible to a smaller percentage. Furthermore, as presented in FIG. 4, the signals of the two opto-receivers 14 and 15 are preferably fed to a multiplexer 19, then amplified in a common amplifier 20, separated again in a demultiplexer 21 and finally fed to an A/D converter 22 so that fluctuations in the amplifier circuit have an equal effect on both signals. For this an output of the first opto-receiver 14 is connected to a first input of the multiplexer 19 and an output of the second opto-receiver 15 is connected to a second input of the multiplexer 19. The control line for the multiplexer 19 and the demultiplexer 21 is designated by the reference mark 23. The ratio of the signal of the first opto-receiver 14 to the signal of the second opto-receiver 15 serving as a reference is formed as the output signal $U_A$ of the sensor 12 which presents a measure for the degree of coverage of the first opto-receiver 14 by the leadframe 1.

Figure 5:
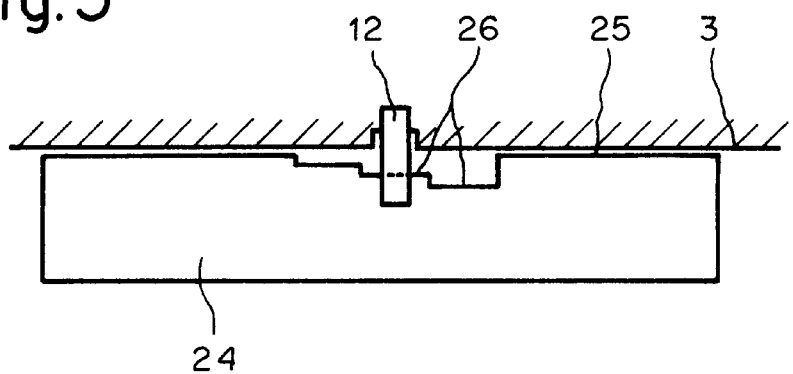
FIG. 5 a calibration plate.

The characteristic curve $U_A(a)$, which presents the relationship between the output signal $U_A$ of the sensor 12 (FIG. 1) and the distance a of the longitudinal edge 4 of the leadframe 1 from the guide rail 3 can occur for example by means of a calibration plate 24 similar to a leadframe which, as shown in FIG. 5, has a straight longitudinal edge 25 with straight edge sections 26 recessed by predetermined values. On registering the characteristic curve $U_A(a)$ the calibration plate 24 is brought to rest on the guide rail 3 and the output signal $U_A$ measured and saved for at least two different edge sections 26.

In normal operation, the current distance a is calculated from the measured output signal $U_A$ and the stored characteristic curve $U_A(a)$ by means of interpolation and shifting of the guide rail 3, the clamp and the leadframe 1 is carried out by the determined distance a in y direction. As soon as this corrective movement is completed, the semiconductor chip can be placed in the right position on the leadframe 1.

Figure 6:
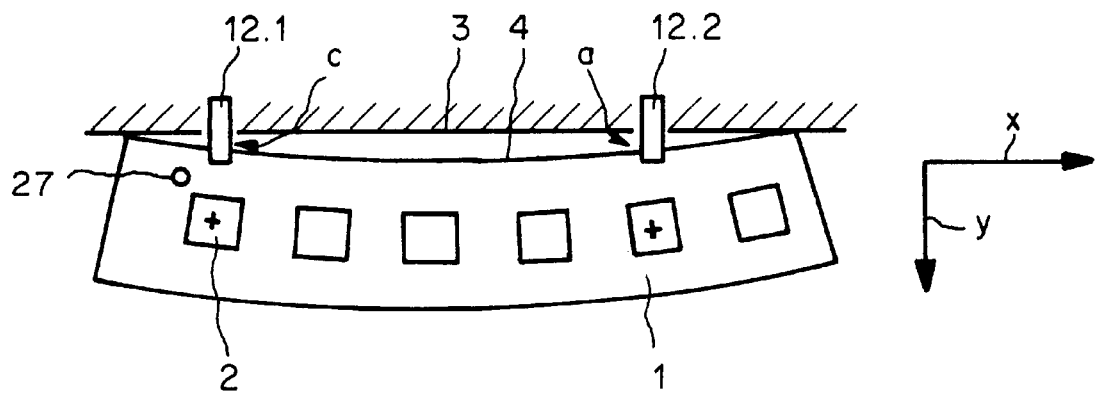
FIG. 6 an apparatus with two sensors.

FIG. 6 shows an apparatus for mounting semiconductor chips on a leadframe 1 which has two rigidly arranged sensors 12.1 and 12.2 for measuring the distance of the longitudinal edge 4 of the leadframe 1 facing the guide rail 3. The apparatus has a dispensing station with a movable writing head 27 led in the horizontal plane in order to apply adhesive to the chip island 2 in a predetermined pattern and the bonding station. Such a dispensing station is described in the U.S. Pat. No. 6,129,040 which is incorporated by reference. The sensor 12.1 is located at the place of the dispensing station in order to measure the distance c of the longitudinal edge 4 of the leadframe 1 to the guide rail 3 here. The sensor 12.2 serves, as described above, to measure the distance a of the longitudinal edge 4 of the leadframe 1 to the guide rail 3 at the location of the bonding station.

If the distance a is now measured in a bonding cycle, then the guide rail 3 is shifted in y direction at right angles to the transport direction x of the leadframe 1. At the same time of course, the relative position of the writing head 27 of the dispensing station changes in relation to the chip island 2. On applying the adhesive to the chip island 2, the writing head 27 is controlled in y direction in consideration of the distance c of the chip island 2 to the guide rail 3 measured by the sensor 12.1 as well as the corrective movement of the guide rail 3 in y direction compensating the distance a.

Thanks to the invention, curved leadframes or, for example, leadframes slightly shifted in their position by the closing and opening of the transport clamps can be presented at the bonding location with an accuracy in micrometers at short cycle times.

What is claimed is:

1. Apparatus for mounting semiconductor chips on a substrate, with which the substrate is forwarded in steps in a first direction to a bonding station for the presentation of a next substrate position, the apparatus comprising a sensor for determining the position of a longitudinal edge of the substrate relative to a second direction orthogonal to the first direction, the sensor having a first light barrier formed from a light source and a first opto-receiver and a second light barrier serving as reference formed from the light source and a second opto-receiver and the sensor being arranged so that in operation the substrate partially covers the first light barrier and does not cover the second light barrier.

2. Apparatus according to claim 1, wherein the first and second opto-receivers are integrated on the same semiconductor chip.

3. Apparatus according to claim 1, further comprising a lens which is arranged so that the light source is located in the focal point of the lens.

4. Apparatus according to claim 2, further comprising a lens which is arranged so that the light source is located in the focal point of the lens.

5. Apparatus according to claim 1, further comprising a multiplexer and a common amplifier series-connected to the multiplexer, wherein an output of the first opto-receiver is connected to a first input of the multiplexer and wherein an output of the second opto-receiver is connected to a second input of the multiplexer.

6. Apparatus according to claim 2, further comprising a multiplexer and a common amplifier series-connected to the multiplexer, wherein an output of the first opto-receiver is connected to a first input of the multiplexer and wherein an output of the second opto-receiver is connected to a second input of the multiplexer.

7. Apparatus according to claim 3, further comprising a multiplexer and a common amplifier series-connected to the multiplexer, wherein an output of the first opto-receiver is connected to a first input of the multiplexer and wherein an output of the second opto-receiver is connected to a second input of the multiplexer.

8. Apparatus according to claim 4, further comprising a multiplexer and a common amplifier series-connected to the multiplexer, wherein an output of the first opto-receiver is connected to a first input of the multiplexer and wherein an output of the second opto-receiver is connected to a second input of the multiplexer.

9. Apparatus according to claim 1, wherein the light source is a light-emitting diode.

10. Apparatus according to claim 2, wherein the light source is a light-emitting diode.

11. Apparatus according to claim 3, wherein the light source is a light-emitting diode.

12. Apparatus according to claim 4, wherein the light source is a light-emitting diode.

13. Apparatus according to claim 5, wherein the light source is a light-emitting diode.

14. Apparatus according to claim 6, wherein the light source is a light-emitting diode.

15. Apparatus according to claim 7, wherein the light source is a light-emitting diode.

16. Apparatus according to claim 8, wherein the light source is a light-emitting diode.

17. Apparatus according to claim 1, wherein in normal operation, the position of the longitudinal edge of the substrate in relation to the second direction is acquired with the sensor and subsequently a corrective movement of the substrate is carried out in the second direction in order to present a next substrate position in the right location.

18. Apparatus according to claim 2, wherein in normal operation, the position of the longitudinal edge of the substrate in relation to the second direction is acquired with the sensor and subsequently a corrective movement of the substrate is carried out in the second direction in order to present a next substrate position in the right location.

19. Apparatus according to claim 3, wherein in normal operation, the position of the longitudinal edge of the substrate in relation to the second direction is acquired with the sensor and subsequently a corrective movement of the substrate is carried out in the second direction in order to present a next substrate position in the right location.

20. Apparatus according to claim 4, wherein in normal operation, the position of the longitudinal edge of the substrate in relation to the second direction is acquired with the sensor and subsequently a corrective movement of the substrate is carried out in the second direction in order to present a next substrate position in the right location.

21. Apparatus according to claim 5, wherein in normal operation, the position of the longitudinal edge of the substrate in relation to the second direction is acquired with the sensor and subsequently a corrective movement of the substrate is carried out in the second direction in order to present a next substrate position in the right location.

* * * * *